(12) United States Patent
Blue et al.

(10) Patent No.: US 8,778,724 B2
(45) Date of Patent: Jul. 15, 2014

(54) HIGH VOLUME METHOD OF MAKING LOW-COST, LIGHTWEIGHT SOLAR MATERIALS

(75) Inventors: Craig A. Blue, Knoxville, TN (US); Art Clemens, Knoxville, TN (US); Chad E. Duty, Knoxville, TN (US); David C. Harper, Kingston, TN (US); Ronald D. Ott, Knoxville, TN (US); John D. Rivard, Arlington, VA (US); Christopher S. Murray, San Diego, CA (US); Susan L. Murray, San Diego, CA (US); Andre R. Klein, San Diego, CA (US)

(73) Assignee: UT-Battelle, LLC, Oak Ridge, TN (US)

( * ) Notice: Subject to any disclaimer, the term of this patent is extended or adjusted under 35 U.S.C. 154(b) by 416 days.

(21) Appl. No.: 12/889,486

(22) Filed: Sep. 24, 2010

(65) Prior Publication Data

US 2012/0073649 A1    Mar. 29, 2012

(51) Int. Cl.
*H01L 31/18*        (2006.01)
*H01L 31/0296*      (2006.01)
*H01L 31/0392*      (2006.01)

(52) U.S. Cl.
CPC ........ *H01L 31/1828* (2013.01); *H01L 31/0296* (2013.01); *H01L 31/1836* (2013.01); *H01L 31/1832* (2013.01); *Y02E 10/543* (2013.01); *H01L 31/02966* (2013.01); *H01L 31/03925* (2013.01)
USPC .................. 438/85; 438/96; 438/98

(58) Field of Classification Search
USPC ............................... 438/61, 84, 89
See application file for complete search history.

(56) References Cited

U.S. PATENT DOCUMENTS

| | | | | | |
|---|---|---|---|---|---|
| 4,937,490 | A | * | 6/1990 | Camm et al. | 313/12 |
| 5,039,354 | A | * | 8/1991 | Nakagawa | 136/249 |
| 5,180,434 | A | * | 1/1993 | DiDio et al. | 118/718 |
| 5,571,749 | A | * | 11/1996 | Matsuda et al. | 438/484 |
| 5,897,332 | A | * | 4/1999 | Hori et al. | 438/61 |
| 6,174,388 | B1 | * | 1/2001 | Sikka et al. | 148/512 |
| 6,432,555 | B1 | * | 8/2002 | Sikka et al. | 428/553 |
| 6,437,292 | B1 | * | 8/2002 | Sikka et al. | 219/411 |
| 6,667,111 | B2 | * | 12/2003 | Sikka et al. | 428/547 |

(Continued)

FOREIGN PATENT DOCUMENTS

WO    2006015328    2/2006

OTHER PUBLICATIONS

Wikipedia definition of copper indium gallium selenide (CIGS), accessed Apr. 16, 2013, (https://en.wikipedia.org/wiki/Copper_indium_gallium_selenide).*

(Continued)

*Primary Examiner* — Earl Taylor
(74) *Attorney, Agent, or Firm* — Warner Norcross & Judd LLP (57) ABSTRACT

A thin film solar cell and a method fabricating thin film solar cells on flexible substrates. The method includes including providing a flexible polymeric substrate, depositing a photovoltaic precursor on a surface of the substrate, such as CdTe, ZrTe, CdZnTe, CdSe or Cu(In,Ga)Se$_2$, and exposing the photovoltaic precursor to at least one 0.5 microsecond to 10 second pulse of predominately infrared light emitted from a light source having a power output of about 20,000 W/cm$^2$ or less to thermally convert the precursor into a crystalline photovoltaic material having a photovoltaic efficiency of greater than one percent, the conversion being carried out without substantial damage to the substrate.

15 Claims, 7 Drawing Sheets

(56) References Cited

U.S. PATENT DOCUMENTS

| | | | |
|---|---|---|---|
| 6,872,970 B2* | 3/2005 | Halls et al. | 257/40 |
| 7,220,936 B2* | 5/2007 | Ott et al. | 219/121.54 |
| 7,235,736 B1* | 6/2007 | Buller et al. | 136/251 |
| 7,700,464 B2* | 4/2010 | Robinson et al. | 438/502 |
| 7,979,969 B2* | 7/2011 | Basol | 29/402.06 |
| 8,071,419 B2* | 12/2011 | Robinson et al. | 438/95 |
| 8,252,619 B2* | 8/2012 | Schaeffer et al. | 438/84 |
| 8,309,163 B2* | 11/2012 | Van Duren et al. | 427/74 |
| 8,318,240 B2* | 11/2012 | Zapalac et al. | 427/74 |
| 8,329,501 B1* | 12/2012 | Robinson et al. | 438/93 |
| 8,372,685 B2* | 2/2013 | Robinson et al. | 438/95 |
| 8,372,734 B2* | 2/2013 | Van Duren et al. | 438/502 |
| 2003/0145679 A1* | 8/2003 | Sikka et al. | 75/228 |
| 2004/0147139 A1* | 7/2004 | Jiang | 438/795 |
| 2005/0217717 A1* | 10/2005 | Faris | 136/252 |
| 2006/0021975 A1* | 2/2006 | Ott et al. | 219/121.8 |
| 2006/0225782 A1* | 10/2006 | Berke et al. | 136/252 |
| 2007/0017568 A1* | 1/2007 | Berke | 136/252 |
| 2007/0044834 A1* | 3/2007 | Berke et al. | 136/262 |
| 2007/0163383 A1* | 7/2007 | Van Duren et al. | 75/255 |
| 2007/0163637 A1* | 7/2007 | Robinson et al. | 136/262 |
| 2007/0163638 A1* | 7/2007 | Van Duren et al. | 136/262 |
| 2007/0163639 A1* | 7/2007 | Robinson et al. | 136/262 |
| 2007/0163640 A1* | 7/2007 | Van Duren et al. | 136/262 |
| 2007/0163641 A1* | 7/2007 | Duren et al. | 136/262 |
| 2007/0163642 A1* | 7/2007 | Van Duren et al. | 136/262 |
| 2007/0163644 A1* | 7/2007 | Van Duren et al. | 136/262 |
| 2007/0169809 A1* | 7/2007 | Van Duren et al. | 136/262 |
| 2007/0169810 A1* | 7/2007 | Van Duren et al. | 136/262 |
| 2007/0169811 A1* | 7/2007 | Van Duren et al. | 136/262 |
| 2007/0169812 A1* | 7/2007 | Robinson et al. | 136/262 |
| 2007/0169813 A1* | 7/2007 | Robinson et al. | 136/262 |
| 2007/0215197 A1* | 9/2007 | Buller et al. | 136/243 |
| 2007/0285843 A1* | 12/2007 | Tran | 360/245.9 |
| 2007/0289626 A1* | 12/2007 | Brabec et al. | 136/263 |
| 2008/0012499 A1* | 1/2008 | Ragay et al. | 315/113 |
| 2008/0023066 A1* | 1/2008 | Hecht et al. | 136/256 |
| 2008/0057203 A1* | 3/2008 | Robinson et al. | 427/337 |
| 2008/0057616 A1* | 3/2008 | Robinson et al. | 438/95 |
| 2008/0121277 A1* | 5/2008 | Robinson et al. | 136/256 |
| 2008/0124831 A1* | 5/2008 | Robinson et al. | 438/84 |
| 2008/0175982 A1* | 7/2008 | Robinson et al. | 427/74 |
| 2008/0264488 A1* | 10/2008 | Balasubramanian et al. | 136/263 |
| 2008/0280030 A1* | 11/2008 | Van Duren et al. | 427/74 |
| 2008/0302418 A1* | 12/2008 | Buller et al. | 136/259 |
| 2009/0032808 A1 | 2/2009 | Bazan et al. | |
| 2009/0107550 A1* | 4/2009 | Van Duren et al. | 136/262 |
| 2009/0126796 A1 | 5/2009 | Yang et al. | |
| 2009/0246906 A1* | 10/2009 | Robinson et al. | 438/84 |
| 2010/0029036 A1* | 2/2010 | Robinson et al. | 438/93 |
| 2010/0032812 A1* | 2/2010 | Sedky et al. | 257/631 |
| 2010/0089453 A1* | 4/2010 | Robinson et al. | 136/264 |
| 2010/0096004 A1* | 4/2010 | Hu et al. | 136/256 |
| 2010/0170564 A1* | 7/2010 | Van Duren et al. | 136/256 |
| 2010/0170566 A1* | 7/2010 | Harmala | 136/256 |
| 2010/0248419 A1* | 9/2010 | Woodruff et al. | 438/95 |
| 2010/0267222 A1* | 10/2010 | Robinson et al. | 438/502 |
| 2010/0291758 A1* | 11/2010 | Robinson et al. | 438/478 |
| 2011/0092010 A1* | 4/2011 | Van Duren et al. | 438/62 |
| 2011/0108115 A1* | 5/2011 | Deligianni et al. | 136/262 |
| 2011/0114182 A1* | 5/2011 | Robinson et al. | 136/262 |
| 2011/0263070 A1* | 10/2011 | Schaeffer et al. | 438/84 |
| 2012/0055554 A1* | 3/2012 | Radu et al. | 136/264 |
| 2012/0073649 A1* | 3/2012 | Blue et al. | 136/258 |
| 2012/0220066 A1* | 8/2012 | Cao | 438/73 |

OTHER PUBLICATIONS

Wikipedia definition of Copper indium gallium selenide (CIGS) solar cells, accessed Apr. 16, 2013, (http://en.wikipedia.org/wiki/Copper_indium_gallium_selenide_solar_cells).*

Noufi et al., High-Efficiency CdTe and CIGS Thin-Film Solar Cells: Highlights and Challenges, IEEE, 2006, pp. 317-320.*

Z.Q. Jin & J.P. Liu, Rapid Thermal Processing of Magnetic Materials (Abstract), J. of Physics D: Applied Physics, vol. 39 No. 14 (Jun. 30, 2006).

* cited by examiner

HIGH VOLUME METHOD OF MAKING LOW-COST, LIGHTWEIGHT SOLAR MATERIALS

This invention was made with government support under Contract No. DE-AC05-00OR22725 awarded by the U.S. Department of Energy. The government has certain rights in the invention.

BACKGROUND OF THE INVENTION

The present invention relates to a method for fabricating solar cells, and more particularly, a method for fabricating solar cells on flexible substrates.

The conversion of light into electricity occurs over a wide variety of photovoltaic materials. For example, photovoltaic materials include single element semiconductors, such as amorphous silicon and thin-film crystalline silicon, as well as compound semiconductors, such as cadmium telluride (CdTe) and copper indium gallium (di)selenide (Cu(In,Ga)Se$_2$ or CIGS). These and other photovoltaic materials absorb photons of energy sufficient to create electron-hole pairs across a junction, thereby creating an internal electric field. The internal electric field results in a buildup of voltage between two electrodes to provide a source of electrical power.

In the fabrication of solar cells, it is often advantageous to gradually anneal the photovoltaic material to thereby improve its photovoltaic efficiency, defined as electrical power output divided by irradiance. A typical annealing process involves the insertion of a photovoltaic precursor into a furnace, together with a substrate, for a period of time. For example, a known annealing process for a CIGS solar cell includes the exposure of a CIGS photovoltaic precursor supported by a glass substrate to high heat for up to several hours. According to this known process, a CIGS precursor material is deposited by close space sublimation or liquid vapor transport and is annealed at temperatures in excess of 600° C. The resulting solar cell can have a photovoltaic efficiency greater than 16% owing in part to the improvement in grain boundaries and grain size during the annealing process.

Annealing the photovoltaic material can improve its photovoltaic efficiency in a number of ways. For example, an annealing step can cause dopants to diffuse or migrate in the material in a controlled manner. In addition, an annealing step can produce grain growth or coalescence of the photovoltaic material and can heal defects in the photovoltaic lattice. In many instances, however, it is desirable to include a flexible substrate, such as a low-cost polymer, in place of the rigid glass or quartz substrates common in the art. Many polymer substrates have an upper operating temperature (i.e., the temperature at which the material will degrade or decompose) well below 400° C., while most photovoltaic precursors are processed according to conventional methods at temperatures in excess of 600° C. As a result, low cost manufacturing approaches such as roll-to-roll techniques are often not permitted due to the high temperature processing required of most photovoltaic precursors. Even where the solar cell includes a thermally-insulating layer between the substrate and the photovoltaic precursor, conventional heating methods can damage both the substrate and the substrate-precursor interface. In the absence of an annealing step, however, the resulting efficiencies can be poor. For example, an untreated CdTe precursor applied to a polymeric substrate by sputter deposition or vapor deposition at room temperature typically results in solar cells with efficiencies of less than 1%.

Therefore, there remains a need for a high-throughput, low-cost method for manufacturing thin film photovoltaic materials on flexible, large area substrates. In particular, there remains a need for an improved process for annealing a photovoltaic precursor deposited on a flexible substrate to leverage the benefits of thin film photovoltaic materials across a wide range of applications.

SUMMARY OF THE INVENTION

The present invention provides a photovoltaic device and a method for manufacturing a photovoltaic device. According to a first aspect of the invention, a photovoltaic device generally includes a photovoltaic layer supported by and optionally in contact with a flexible substrate, wherein the photovoltaic layer is at least partially annealed in situ on the substrate with exposure to at least one pulse of predominantly infrared light without exceeding the upper operating temperature of the substrate. The photovoltaic layer can have a photovoltaic efficiency of greater than 1%, optionally greater than 5%. The photovoltaic layer can be formed from a precursor, such as CdTe, ZrTe, CdZnTe, CdSe and Cu(In,Ga)Se$_2$, deposited at or near room temperature on the flexible substrate. The photovoltaic layer can be at least partially annealed with exposure to a series of pulses of infrared light from a directed plasma arc having a power output of about 20,000 W/cm$^2$ or less. The photovoltaic layer can include an annealing temperature that substantially exceeds the flexible substrate upper operating temperature. The flexible substrate can be formed from a polymeric material, such as polyimide or polycarbonate for example. The flexible substrate can optionally form a continuous web moveable with respect to a stationary source of pulsed infrared light. In addition, the continuous web can be operable to move continuously or step-wise with respect to a stationary source of pulsed infrared light.

According to a second aspect of the present invention, a method of manufacturing a photovoltaic device includes exposing a photovoltaic precursor to energy of a sufficient intensity and for sufficient duration to convert the precursor into a crystalline photovoltaic material without materially affecting an underlying substrate. In particular, the method can include directing one or more intense pulses of radiant energy toward a superficial region of the photovoltaic precursor opposite the substrate without causing the substrate to exceed its upper operating temperature, thereby achieving a grain growth and an increased photovoltaic efficiency.

In one embodiment, the method can include providing a flexible substrate, depositing a photovoltaic precursor on the substrate, and exposing the photovoltaic precursor to energy of a sufficiently high intensity and for sufficiently low duration to achieve grain growth without materially thermally affecting the underlying substrate. The flexible substrate can be formed from a polymeric material, such as polyimide or polycarbonate for example. The photovoltaic precursor can be selected from the group consisting of CdTe, ZrTe, CdZnTe, CdSe and Cu(In,Ga)Se$_2$, though other precursors can also be utilized as desired. The exposing step can include exposing the precursor to at least one pulse of predominately infrared light emitted from a light source having a power output of up to about 20,000 W/cm$^2$ or less to thermally convert the precursor into a crystalline photovoltaic material having a photovoltaic efficiency greater than one percent, the conversion being carried out without causing the substrate to exceed its upper operating temperature. The exposing step can remove impurities from the photovoltaic precursor while maintaining low substrate temperatures (for example, as low as 130° C.) by heating a superficial region of the photovoltaic precursor opposite the substrate, while the downward diffusion of heat from the superficial region of the photovoltaic precursor is limited due to the relatively short pulse duration of the infrared pulse. For example, the pulse duration can be between 0.5 microseconds and 10 seconds, optionally between 10 microseconds and 100 milliseconds. The method can further include controlling a characteristic of an infrared pulse sequence in response to a detected change in the temperature of the polymeric substrate. The characteristic can include one of pulse duration, periodicity, peak wavelength and/or intensity, for example.

The present invention provides an effective photovoltaic device and method for fabricating a photovoltaic device on a substrate having a relatively low upper operating temperature. The method of the present invention is relatively inexpensive and permits the use of polymeric substrates that might otherwise be damaged by energy or heat from conventional methods. In addition, the use of polymeric substrates can greatly reduce the weight of the photovoltaic device and can eliminate the cost and complexity of prior art methods of crystallizing photovoltaic precursors. Combining the pulsed thermal processing of the present invention with high volume deposition techniques can result in moderately efficient solar cells with greater than 5% efficiency at extremely low manufacturing costs (~$0.30/W).

These and other features and advantages of the present invention will become apparent from the following description of the invention, when viewed in accordance with the accompanying drawings and appended claims.

DETAILED DESCRIPTION OF THE CURRENT EMBODIMENT

The invention as contemplated and disclosed herein can greatly improve the manufacture and processing of high efficiency photovoltaics. In particular, the present invention includes a process using intense pulses of radiant energy to improve the material quality and grain size of photovoltaic precursor(s) supported by a flexible substrate.

Figure 1:
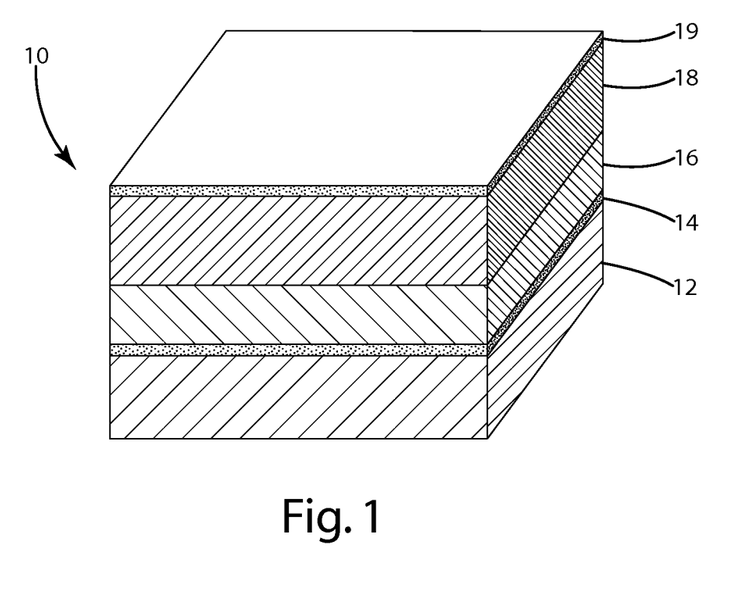
FIG. 1 is a perspective view of a photovoltaic device fabricated in accordance with the present invention.

FIG. 1 shows a partial cross-section of one example of a photovoltaic device 10 manufactured in accordance with the present invention. The photovoltaic device 10 can form part of a solid-state semiconductor solar cell or any other photovoltaic cell adapted to convert solar energy into electricity. The photovoltaic device 10 may be fabricated in sheets of a size appropriate for its intended use. It may also be fabricated on small substrates or in configurations other than sheets. For example, the photovoltaic device 10 may be fabricated as a small solar cell for a hand-held electronic device or on large sheets to be applied to large areas such as windows, vehicles or buildings.

Referring now to FIG. 1, the photovoltaic device 10 includes a substrate 12, an optional electrode layer 14, and a photovoltaic layer 16. The substrate 12 may include one or more substantially planar or non-planar surfaces, and may include a suitable dielectric or conductor that is flexible at room temperature. For example, the substrate 12 may be formed of a polymeric material such as polyimide (sold under the trademark Kapton® by DuPont) or polycarbonate, though other suitable polymeric materials can also be utilized. The optional electrode layer 14 can be formed of a suitable electrically conductive material. For example, the electrode layer 14 can include molybdenum (Mo), although many other electrically conductive materials can be used, including tantalum (Ta), tungsten (W) and titanium (Ti). In other embodiments the electrode layer 14 can include a transparent conducting oxide such as zinc oxide (ZnO) or indium tin oxide (ITO), for example. The photovoltaic layer 16 may include any suitable p-type or n-type semiconductor material. For example, the photovoltaic layer 16 can include a thin-film, light absorbing group II-VI or group I-III-VI compound, though other compounds or single element semiconductors could also be utilized. For example, the group II-VI compounds may include CdTe, CdS, CdSe, ZnTe, ZrTe, ZnSe or ZnS, or combinations thereof. In addition, the group I-III-VI compounds may include CdZnTe, CuInTe$_2$ or Cu(In,Ga)Se$_2$, or combinations thereof. The photovoltaic layer 16 can demonstrate a photovoltaic efficiency (electrical power output divided by irradiance) of less than about one percent when deposited on or over the substrate 12 as a precursor, and greater than about one percent once treated according to the present invention.

As also shown in FIG. 1, the photovoltaic device 10 can include a suitable n-type (or p-type) photovoltaic layer 18 adjacent the p-type (or n-type) photovoltaic layer 16, forming an electron-hole junction therebetween. For example, the n-type photovoltaic layer 18 can include an n-doped CdS photovoltaic layer, though other photovoltaic layers can also be utilized. The photovoltaic device 10 can further include an optional front electrode layer 19 supported by and optionally in contact with the n-type photovoltaic layer 18. The optional front electrode layer 19 can include a transparent conducting oxide such as zinc oxide (ZnO) or indium tin oxide (ITO), for example. In addition, the photovoltaic device 10 can include one or more junction layers (not shown) deposited between the p-type photovoltaic layer 16 and the n-type photovoltaic layer 18. For example, the photovoltaic device 10 can include a thin layer of intrinsic ZnO to form a heterojunction between an p-type precursor 16 and an n-type precursor 18. The resulting photovoltaic device 10 can therefore form a thin-film solar cell, for example a CdTe/CdS or a CIGS/CdS solar cell, tailored to generate an electric current when irradiated with solar energy.

Returning again to FIG. 1, the photovoltaic layer 16 can be deposited on the substrate 12, directly or indirectly, according to any suitable technique. In particular, the photovoltaic layer 16 can be deposited as an amorphous or crystalline precursor. For example, the photovoltaic layer 16 can be deposited by solution deposition, screen printing, sputtering, sol-gel, vapor deposition, thermal spraying, or cold-spraying, optionally at room temperature. Alternatively, the photovoltaic layer 16 can simply include a wafer cut from a crystalline semiconductor. In addition, the photovoltaic layer 16 can optionally be secured to the underlying substrate 12 via a suitable binder (not shown), including, for example, polyvinyl alcohol. As noted above, the photovoltaic layer 16 of the photovoltaic device 10 can achieve a photovoltaic efficiency of greater than 1 percent, for example approximately 5 percent. In order to achieve the desired photovoltaic efficiency, the photovoltaic layer 16—while supported directly or indirectly by the underlying substrate 12—can be subject to pulsed thermal processing with minimal or no thermal effect to the underlying substrate 12. That is, the superficial region of a photovoltaic precursor 16 opposite the substrate 12 is exposed to high-intensity pulses of energy in situ on the substrate, while the downward diffusion of heat from the superficial region of the photovoltaic precursor 16 toward the underlying substrate 12 is limited due to the short pulse duration of the pulsed thermal processing.

Figure 2:
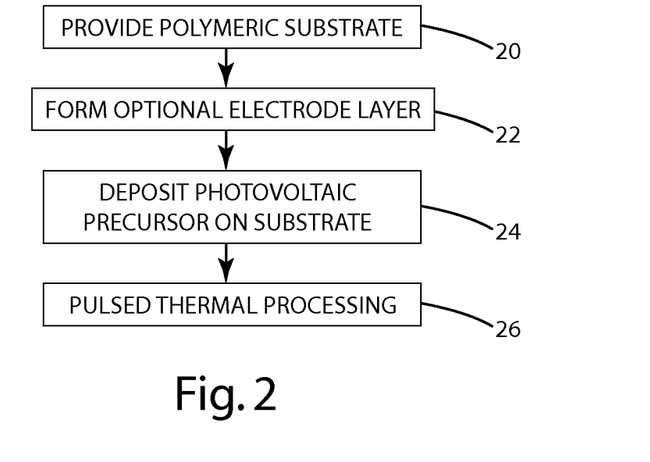
FIG. 2 is a flow-chart of an embodiment of the present invention.

One example of pulsed thermal processing includes using a high intensity arc lamp, and is generally described in connection with FIG. 2. While FIG. 2 shows a specific embodiment of pulsed thermal processing, it is not intended to be the only manner in which a photovoltaic device 10 may be fabricated. Referring now to step 20, a suitable substrate is provided, optionally forming a continuous web. The substrate may include a material that is generally flexible at room temperature. For example, flexible substrates such as polyimide and polycarbonate may be utilized. Rigid substrates such as glass, crystal, acrylic or ceramic may also be utilized. At step 22, an optional conducting layer is formed on the substrate. The optional conducting layer can include a metalized layer of molybdenum (Mo), tantalum (Ta), tungsten (W) and titanium (Ti), or other suitable materials, or combinations thereof. Alternatively, or in addition, the conducting layer can include a transparent conducting oxide, such as zinc oxide (ZnO) or indium tin oxide (ITO), for example. In addition, the conducting layer may be a single layer or multiple layers as desired for the particular application. The optional conducting layer can be deposited according to any suitable method, including roll-to-roll processing techniques or chemical vapor deposition, for example. Once fabricated, the optional conducting layer can form an electrode for generating a voltage or electric potential with respect to a counter-electrode.

At step 24, a photovoltaic precursor is deposited on the substrate. The precursor may include a group II-VI or group I-III-VI semiconductor material, though other suitable precursors can also be utilized. As noted above, the precursor can be deposited on the substrate (and the optional conducting layer) according to any suitable method. For example, the photovoltaic precursor can be deposited by solution deposition, screen printing, sputtering, sol-gel, vapor deposition, thermal spraying, or cold-spraying, optionally at room temperature. Other suitable deposition methods may also be utilized. Alternatively, the photovoltaic precursor can simply include a wafer cut from a crystalline semiconductor. In addition, the photovoltaic precursor can be a p-type semiconductor material or an n-type semiconductor material as desired. At step 26, the photovoltaic precursor is exposed to at least one 0.5 microsecond to 10 second pulse of predominately infrared light emitted from a light source having a power output of up to about 20,000 W/cm$^2$ or less to thermally convert the precursor into a crystalline photovoltaic material having an increased photovoltaic efficiency, optionally greater than 1%, the conversion being carried out without substantial damage to the flexible substrate. The infrared energy can heat the superficial region of the photovoltaic precursor opposite the substrate, while the downward diffusion of heat from the superficial region of the photovoltaic precursor is limited due to the short pulse duration of the infrared pulse. The flexible substrate can include an upper operating temperature, wherein the temperature required to achieve grain grown in the photovoltaic precursor (e.g., the annealing temperature) is greater than the upper operating temperature of the substrate. Throughout the above process, the temperature of the substrate can remain below 200° C., optionally as low as 130° C., to thereby permit the use of flexible, polymeric substrates without substantial damage to the same.

Application of a source of pulsed infrared light can be accomplished using a high density infrared plasma arc lamp ("directed plasma arc"). Operation of a suitable directed plasma arc is described in U.S. Pat. No. 4,937,490 to Camm et al and U.S. Pat. No. 7,220,936 to Ott et al, which are hereby incorporated by reference in their entirety. The directed plasma arc can provide power densities of about 20,000 W/cm$^2$ or less over areas in excess of 300 cm$^2$, though alternative sources of pulsed energy having power densities greater than about 20,000 W/cm$^2$ can also be utilized. As applied to photovoltaic precursors deposited on flexible, optionally polymeric, substrates, the pulse duration, pulse intensity, and pulse periodicity (if more than one pulse) can vary as desired to increase the photovoltaic efficiency of the precursor without causing the substrate to exceed its upper operating temperature. For example, the duration of a pulse of infrared light from the directed plasma arc (or other suitable source of pulsed infrared light) can be any duration within the range of 0.5 microseconds to 10 seconds inclusive, optionally between 10 microseconds and 100 milliseconds, inclusive. Pulse duration can be held to a single duration throughout pulsed thermal processing, or it can be varied as desired within a defined range. The pulse intensity can vary within the range of 50 W/cm$^2$ to about 20,000 W/cm$^2$, inclusive, though in other embodiments the pulse intensity can vary outside this range, including, for example, 40,000 W/cm$^2$. In addition, pulse periodicity—defined as the time period between the end of one pulse and the beginning of the next pulse—can vary as desired to permit the temperature of the substrate and/or the precursor to cool to a predetermined temperature (e.g., room temperature) before application of a subsequent pulse. The periodicity can be held to a single periodicity throughout pulsed thermal processing, or can be varied as desired within a defined range. For example, the periodicity can include a lower limit of about 100 nanoseconds in one embodiment, with no practical upper limit, while in other embodiments, the periodicity can vary as desired. In addition, the standoff distance between the source of pulsed infrared light and the precursor can vary as desired, but in the present embodiment can include a standoff distance of 2.5 cm.

The high intensity and short exposure time of pulsed thermal processing can assist in the crystallization of amorphous photovoltaic precursors and re-crystallization or sintering of crystalline photovoltaic precursors. In addition, pulsed thermal processing of the present invention can assist in grain boundary refinement and grain growth in crystalline photovoltaic precursors to achieve increased photovoltaic efficiencies. The resulting photovoltaic device can achieve efficiencies greater than 5%, and can be suitably adapted to form part of a flexible solid-state semiconductor solar cell, or any other flexible photovoltaic cell adapted to covert solar energy into electricity. For example, the resulting photovoltaic device can form part of a thin-film solar cell including a p-type CdTe or CIGS photovoltaic layer supported by a polymeric layer and adjacent an n-type CdS photovoltaic layer. In this embodiment, one or both of the p-type photovoltaic layer and the n-type photovoltaic layer can be annealed via pulse thermal processing. For example, the p-type photovoltaic layer can be annealed via pulse thermal processing before application of the n-type photovoltaic layer. Alternatively, the p-type photovoltaic layer and the n-type photovoltaic layer can be annealed via pulsed thermal processing after application of the n-type photovoltaic layer. In other embodiments, the solar cell can include an n-type photovoltaic layer between a flexible substrate and a p-type photovoltaic layer distal. As noted above, one or both of the n-type photovoltaic layer and the p-type photovoltaic layer can be annealed via pulse thermal processing, sequentially or substantially simultaneously.

Figure 3:
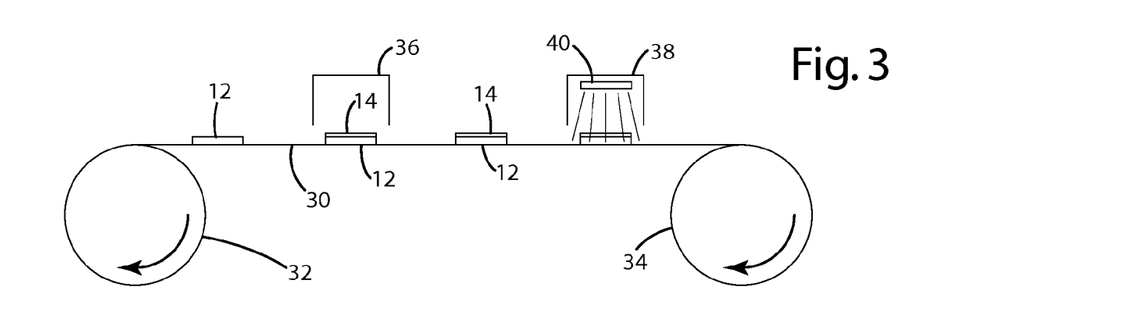
FIG. 3 is a schematic view of a roll-to-roll process for manufacturing photovoltaic devices in accordance with an embodiment of the present invention.

The present invention can greatly reduce the production costs associated with the manufacture of thin film, flexible solar cells. A high-throughput, low-cost system for fabricating flexible solar cells is shown in connection with FIG. 3. The system includes a web 30 extending between first and second spools 32, 34. In the present embodiment, the first spool 32 is an unwinding spool and the second spool 34 is a winding spool. The web 30 can extend through a deposition chamber 36 and an annealing chamber 38. The web 30 may be operable to transport a polymeric substrate 12 through the deposition chamber 36 and the annealing chamber 38, or the web may itself be the flexible substrate upon which a photovoltaic precursor is to be deposited. The deposition chamber 36 can define a region to contain at least one deposition assembly (not shown). The annealing chamber 38 can similarly define a region containing a suitable source of high intensity pulsed infrared light 40. For example, the annealing chamber can include a directed plasma arc operable to supply power densities up to about 20,000 W/cm$^2$ or less over areas in excess of 300 cm$^2$. According to the illustrated embodiment, the web 30, either as a transportation medium or as a substrate to be coated, is unwound from the first spool 32. As the web 30 travels through the first deposition chamber 36, the deposition assembly or assemblies deposit a photovoltaic precursor 16, directly or indirectly, to the underlying substrate 12. For example, the deposition assembly can deposit the precursor on an electrode layer 14 supported by the underlying substrate. As deposited, the precursor can have a photovoltaic efficiency of less than 1%. As the web 30 continues through the annealing chamber 38, the photovoltaic precursor 16 is exposed to at least one pulse of predominately infrared light emitted from the directed plasma arc 40 (or other suitable device) having a power output of up to about 20,000 W/cm$^2$ or less to thermally convert the precursor into a crystalline photovoltaic material having a photovoltaic efficiency greater than 1%, the conversion being carried out without substantial damage to the substrate 12 and/or web 30. As will be appreciated, transfer of the substrate 12 through the deposition chamber 36 and the annealing chamber 38 can be continuous or step-wise as desired. Numerous other chambers may be positioned over (or under) the web 30, including a second deposition chamber and a second annealing chamber for the application and processing of an n-type photovoltaic precursor, respectively. Though not shown, the system can also include the application of other coatings, including conducting layers and heterojunction layers, optionally via screen printing methods known in the art.

Figure 4:
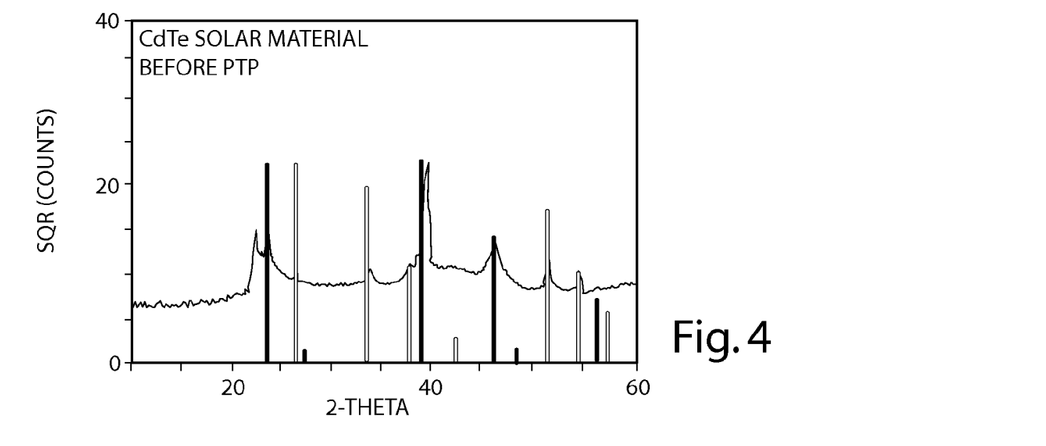
FIG. 4 is an x-ray diffraction pattern of a CdTe thin film prior to pulsed thermal processing.
Figure 5:
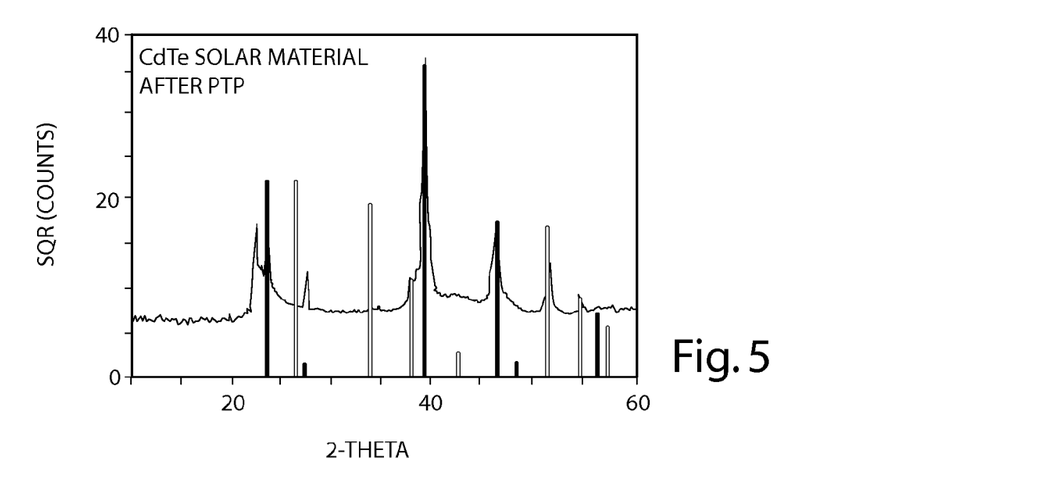
FIG. 5 is an x-ray diffraction pattern of a CdTe thin film subsequent to pulsed thermal processing.
Figure 6:
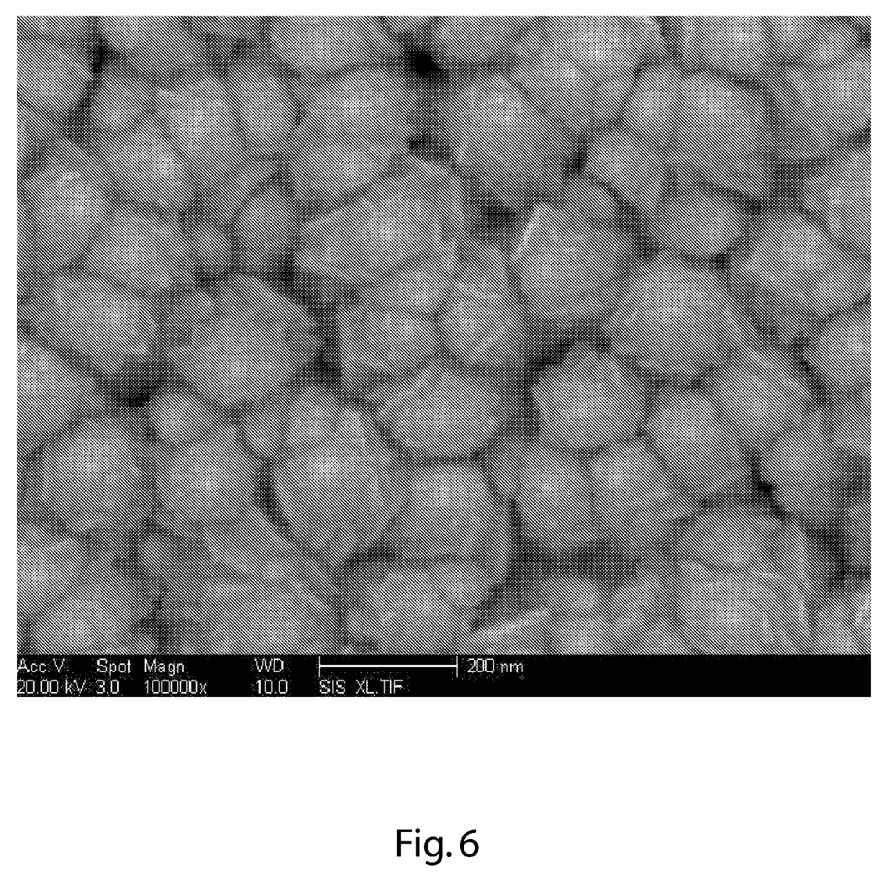
FIG. 6 is a cross-section transmission electron microscopy image of a CdTe thin film from an experiment performed prior to pulsed thermal processing.
Figure 7:
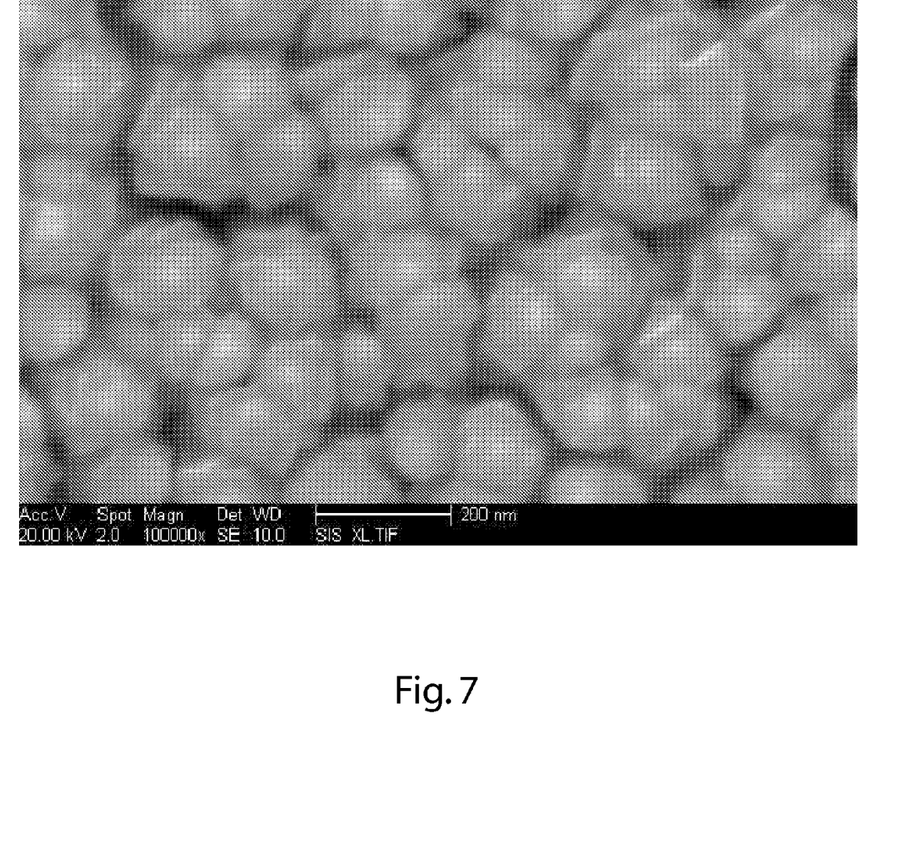
FIG. 7 is a cross-section transmission electron microscopy image of a CdTe thin film from an experiment performed subsequent to pulsed thermal processing.
Figure 8:
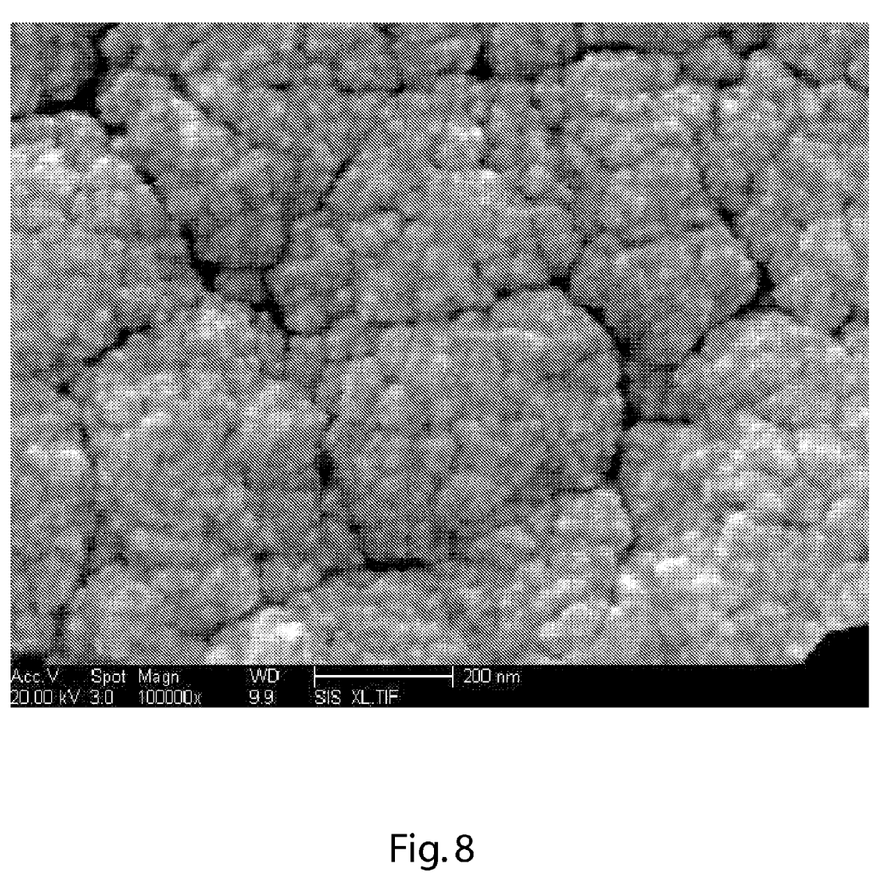
FIG. 8 is a cross-section transmission electron microscopy image of a CdTe thin film from an experiment performed subsequent to pulsed thermal processing.
Figure 9:
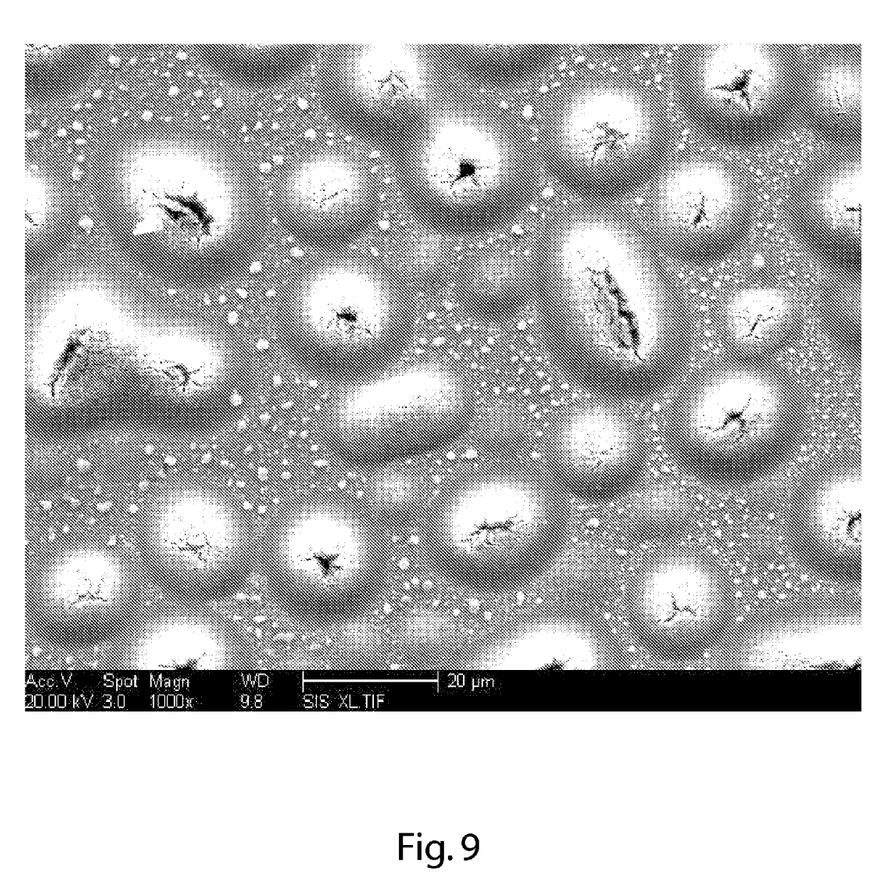
FIG. 9 is a cross-section transmission electron microscopy image of a CdTe thin film from an experiment performed subsequent to pulsed thermal processing.
Figure 10:
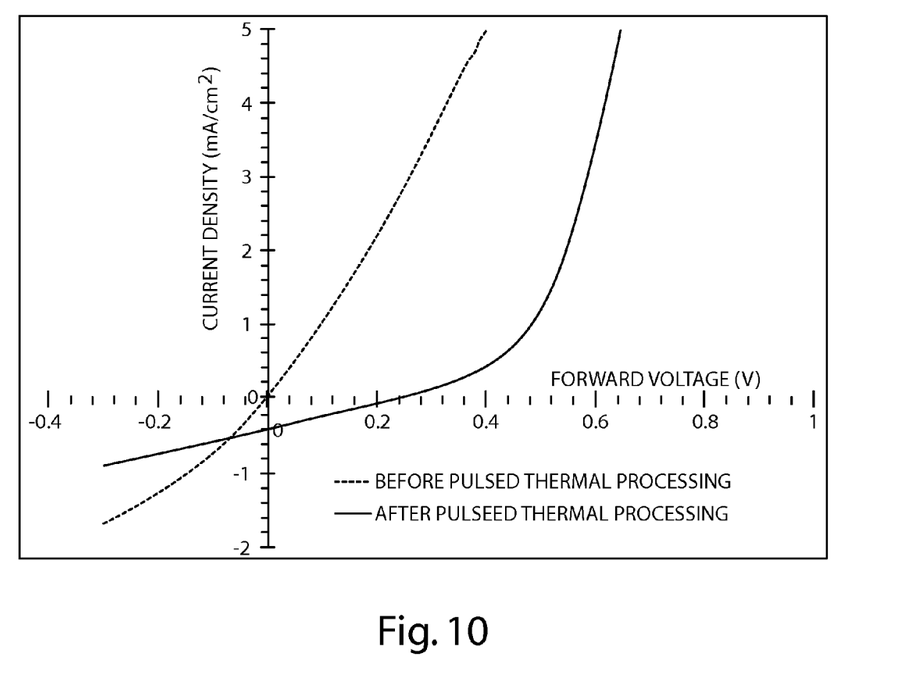
FIG. 10 is graph illustrating forward current density (mA/cm$^2$) versus forward voltage (V) before and after pulsed thermal processing of the photovoltaic precursor.

One embodiment of the invention is further illustrated by the following example, in which a CdTe photovoltaic precursor was exposed to pulsed thermal processing to increase its photovoltaic efficiency from less than 1% to greater than 5%. A CdTe thin film was initially applied to a polyimide substrate (sold under the trademark Kapton® by DuPont) by sputter deposition at room temperature. FIG. 4 shows the x-ray diffraction pattern of the as-deposited CdTe precursor. The main diffraction peak at 2θ(39) indicates the initial CdTe deposit was crystalline. As deposited, the CdTe precursor was estimated to have a photovoltaic efficiency of less than 1%. Pulsed thermal processing was used to tailor the deposition for crystal axis, morphology, and other properties. As shown in FIG. 5, the after-pulse thermal processing x-ray diffraction spectra reveals that the pulsed thermal processing increased the crystallinity of the CdTe deposit. In particular, with the application of pulsed thermal processing, the main diffraction peak for CdTe grew stronger and narrower, indicating grain growth within the crystalline structure. FIGS. 6-9 display the cross-section transmission electron microscopy images of this p-type CdTe photovoltaic layer prior to (FIG. 6) and subsequent to annealing (FIGS. 7-9). The grain boundary refinement and grain growth can be readily observed, revealing (nearly) complete sintering over the course of the pulsed thermal processing. The larger grain size in FIGS. 7-9 helps ensure the positive charged holes generated during solar exposure are not recombined at the grain boundaries, thus adding to the photovoltaic efficiency of the pulse annealed CdTe deposit. In addition, the above process achieved a crystalline CdTe layer estimated to have photovoltaic efficiencies of greater than five percent, while the underlying polyimide substrate remained at temperatures well below its upper operating temperature. As the J-V curve of FIG. 10 illustrates, the pulsed thermal processing of the CdTe device had a positive effect on device performance, activating the p/n junction to create a solar cell (solid line) from what was essentially a resistor in the as-deposited state (broken line).

It is estimated that the pulsed thermal processing annealing process of the present invention when used with high volume deposition techniques can result in moderately efficient solar cells (~10%) at extremely low manufacturing costs (~$0.30/W). The low substrate temperatures also permit the direct use of flexible polymer substrates, which can greatly reduce the solar cell weight and can eliminate the cost and complexity of prior art methods of annealing photovoltaic materials. For example, flexible thin film solar cells manufactured according to the present invention can be utilized in conjunction with building integrated photovoltaics (BIPV), fabrics (clothes, backpacks, temporary shelters, etc.) and consumer electronic products (cell phones, laptops, cameras, etc.). In addition, thin film solar cells manufactured according to the present invention can include one or more energy storage devices positioned adjacent the flexible substrate opposite the photovoltaic layer. For example, the thin film solar cell can include multiple series-connected photovoltaic devices positioned on a single flexible substrate. The solar cell could provide power to charge a battery through a blocking diode when exposed to sunlight. In the absence of sunlight, the energy storage device can then provide power to a battery according to its specific needs.

The above description is that of current embodiments of the invention. Various alterations and changes can be made without departing from the spirit and broader aspects of the invention as defined in the appended claims, which are to be interpreted in accordance with the principles of patent law including the doctrine of equivalents. Any reference to elements in the singular, for example, using the articles "a," "an," "the," or "said," is not to be construed as limiting the element to the singular.

The embodiments of the invention in which an exclusive property or privilege is claimed are defined as follows:

1. A method of manufacturing a photovoltaic device comprising the steps of:
   providing a polymeric substrate including an upper operating temperature, the polymeric substrate being selected from the group consisting of polyamide and polycarbonate;
   applying an electrode layer over the polymeric substrate, the electrode layer being applied in roll-to-roll processing and including a material selected from the group consisting of Mo, Ta, W, Ti, ZnO, and ITO;
   depositing an amorphous photovoltaic precursor directly or indirectly over the polymeric substrate and the electrode layer, the amorphous photovoltaic precursor including a photovoltaic efficiency of less than 1% and being selected from the group consisting of CdTe, CdS, CdSe, ZnTe, ZrTe, ZnSe, ZnS, CdZnTe, CuInTe$_2$ and Cu(In,Ga)Se$_2$; and
   exposing the photovoltaic precursor to at least one pulse of predominately infrared light from a source of pulsed infrared light to thermally convert the photovoltaic precursor, at an annealing temperature that exceeds the upper operating temperature of the polymeric substrate, into a crystalline photovoltaic material having a photovoltaic efficiency of greater than 1% without causing the polymeric substrate to exceed the substrate upper operating temperature of the polymeric substrate, wherein the polymeric substrate forms a roll-formed web moveable with respect to the source of pulsed infrared light.

2. The method according to claim 1 wherein depositing the photovoltaic precursor includes at least one of screen printing, sputter deposition, solution deposition, vapor deposition, and cold spraying.

3. The method according to claim 1 wherein the source of pulsed infrared light includes a power output of about 20,000 W/cm$^2$.

4. The method according to claim 1, wherein the thermally converted precursor includes a photovoltaic efficiency of greater than 5%.

5. The method according to claim 1, wherein the pulse includes a pulse duration of between 10 microseconds and 100 milliseconds.

6. The method according to claim 1, wherein the temperature of the substrate remains below 200° C. during the exposing step.

7. The method according to claim 1 wherein the polymeric substrate is flexible at room temperature.

8. The method according to claim 7 wherein the roll-formed web is operable to move at least one of continuously and step-wise with respect to the stationary source of pulsed infrared light.

9. A method of fabricating a solar cell comprising the steps of:
   providing a continuous web including a polymeric substrate selected from the group consisting of polyamide and polycarbonate, the polymeric substrate being flexible at room temperature and defining an upper operating temperature of less than 400° C.;
   positioning an electrode layer over the polymeric substrate, the electrode layer being drawn from a roll including a material selected from the group consisting of Mo, Ta, W, Ti, ZnO, and ITO;
   depositing an amorphous photovoltaic precursor over the polymeric substrate and over the electrode layer while substantially at room temperature, the amorphous photovoltaic precursor including a photovoltaic efficiency of less than 1% and being selected from the group consisting of CdTe, CdS, CdSe, ZnTe, ZrTe, ZnSe, ZnS, CdZnTe, CuInTe$_2$ and Cu(In,Ga)Se$_2$; and
   annealing the amorphous photovoltaic precursor while in situ over the flexible polymeric substrate and over the electrode layer with exposure to at least one pulse of predominately infrared light directed to an upper superficial region of the photovoltaic precursor, wherein the photovoltaic precursor achieves an annealing temperature that exceeds the upper operating temperature of the polymeric substrate, and wherein the photovoltaic efficiency of the photovoltaic precursor increases from less than 1% to greater than 5% while the temperature of polymeric substrate remains below 200° C.

10. The method according to claim 9 further including spooling the solar cell after annealing the photovoltaic precursor.

11. The method according to claim 9 wherein depositing the photovoltaic precursor over the polymeric substrate and over the electrode layer while substantially at room temperature includes solution deposition.

12. The method according to claim 9 wherein depositing the photovoltaic precursor over the polymeric substrate and over the electrode layer while substantially at room temperature includes screen printing.

13. The method according to claim 9 wherein depositing the photovoltaic precursor over the polymeric substrate and over the electrode layer while substantially at room temperature includes sputter deposition.

14. The method according to claim 9 wherein depositing the photovoltaic precursor over the polymeric substrate and over the electrode layer while substantially at room temperature includes vapor deposition.

15. The method according to claim 9 wherein depositing the photovoltaic precursor over the polymeric substrate and over the electrode layer while substantially at room temperature includes cold-spraying.

* * * * *